United States Patent
Daibou et al.

(10) Patent No.: US 11,355,694 B2
(45) Date of Patent: Jun. 7, 2022

(54) MAGNETIC MEMORY DEVICE

(71) Applicant: Kioxia Corporation, Tokyo (JP)

(72) Inventors: Tadaomi Daibou, Mie (JP); Yasushi Nakasaki, Kanagawa (JP); Tadashi Kai, Kanagawa (JP); Hiroki Kawai, Aichi (JP); Takamitsu Ishihara, Kanagawa (JP); Junichi Ito, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/570,020

(22) Filed: Sep. 13, 2019

(65) Prior Publication Data
US 2020/0303628 A1    Sep. 24, 2020

(30) Foreign Application Priority Data

Mar. 20, 2019 (JP) .............................. JP2019-052166

(51) Int. Cl.
*H01L 43/02* (2006.01)
*H01L 43/10* (2006.01)
*H01L 27/22* (2006.01)

(52) U.S. Cl.
CPC ............ *H01L 43/02* (2013.01); *H01L 27/222* (2013.01); *H01L 43/10* (2013.01)

(58) Field of Classification Search
CPC .................................. H01L 43/02; H01L 43/10
See application file for complete search history.

(56) References Cited

U.S. PATENT DOCUMENTS

| | | | |
|---|---|---|---|
| 9,397,287 B1* | 7/2016 | Annunziata | H01L 43/02 |
| 10,522,746 B1* | 12/2019 | Sundar | G11C 11/161 |
| 2006/0163676 A1 | 7/2006 | Shimizu et al. | |
| 2009/0067232 A1* | 3/2009 | Korenivski | G11C 11/16 365/171 |
| 2011/0031569 A1 | 2/2011 | Watts et al. | |
| 2011/0032644 A1 | 2/2011 | Watts et al. | |
| 2012/0155156 A1 | 6/2012 | Watts et al. | |

(Continued)

FOREIGN PATENT DOCUMENTS

| | | |
|---|---|---|
| JP | 4185056 B2 | 1/2005 |
| JP | 2013069788 A | 4/2013 |

(Continued)

OTHER PUBLICATIONS

Bean, et al., "Atomic structure and electronic properties of MgO grain boundaries in tunnelling magnetoresistive devices", Scientific Reports, Apr. 4, 2017, vol. 7, No. 45594, pp. 1-9.

(Continued)

*Primary Examiner* — Jay C Chang
*Assistant Examiner* — Mikka Liu
(74) *Attorney, Agent, or Firm* — Holtz, Holtz & Volek PC

(57) ABSTRACT

According to one embodiment, a magnetic memory device includes a stacked structure including a first magnetic layer having a variable magnetization direction, a second magnetic layer having a fixed magnetization direction, and a nonmagnetic layer provided between the first magnetic layer and the second magnetic layer, and containing magnesium (Mg) and oxygen (O). The nonmagnetic layer further contains an additive element selected from fluorine (F), sulfur (S), hydrogen (H) and lithium (Li).

18 Claims, 1 Drawing Sheet

(56) References Cited

U.S. PATENT DOCUMENTS

| | | | |
|---|---|---|---|
| 2012/0205762 A1* | 8/2012 | Matsukawa | H01F 41/302 257/421 |
| 2012/0231945 A1* | 9/2012 | Watanabe | C04B 35/58 501/98.5 |
| 2013/0069182 A1 | 3/2013 | Ohsawa et al. | |
| 2013/0142324 A1 | 6/2013 | Nagai et al. | |
| 2013/0145162 A1 | 6/2013 | Nagai et al. | |
| 2013/0249026 A1* | 9/2013 | Kitagawa | H01F 10/3295 257/421 |
| 2014/0008742 A1 | 1/2014 | Chen et al. | |
| 2015/0225297 A1* | 8/2015 | Sato | C23C 14/3414 204/298.13 |
| 2016/0155932 A1 | 6/2016 | Chen et al. | |
| 2017/0155042 A1 | 6/2017 | Yuasa | |
| 2017/0186943 A1 | 6/2017 | Annunziata et al. | |
| 2017/0236999 A1* | 8/2017 | Kim | H01L 43/08 438/3 |
| 2017/0358737 A1 | 12/2017 | Chen et al. | |
| 2018/0261269 A1 | 9/2018 | Roiz | |
| 2018/0346851 A1* | 12/2018 | Moon | H01L 21/3213 |
| 2019/0064661 A1 | 2/2019 | Yang et al. | |

FOREIGN PATENT DOCUMENTS

| | | |
|---|---|---|
| JP | 2013118607 A | 6/2013 |
| JP | 2013197345 A | 9/2013 |
| JP | 2013254957 A | 12/2013 |
| JP | 5873366 B2 | 1/2016 |
| JP | 6067306 B2 | 1/2017 |
| JP | 2018501647 A | 1/2018 |

OTHER PUBLICATIONS

De Vita, et al., "Defect energetics in MgO treated by first-principles methods", Physical Review B, Nov. 11, 1992, vol. 46, No. 20, 13 pages.

Gibson, et al., "Stability of vacancy defects in MgO: The role of charge neutrality", Physical Review B, Jul. 15, 1994, vol. 7, No. 4, pp. 2582-2592.

Harris, et al., "Computer simulation of pressure-induced structural transitions in MgO [001] tilt grain boundaries", American Mineralogist, 1999, vol. 84, pp. 138-143.

Jung, et al., "Electrical properties of plasma display panel with Mg1—xZnxO protecting thin films deposited by a radio frequency magnetron sputtering method", Applied Physics Letters, Apr. 6, 2005, vol. 86, pp. (153503-1)-(153503-3).

Watson, et al., "Atomistic simulation of dislocations, surfaces and interfaces in MgO", Journal of the Chemical Society, Faraday Transactions, 1996, vol. 92, No. 3, pp. 433-438.

Mckenna, et al., "First-principles calculations of defects near a grain boundary in MgO", Physical Review B (vol. 79, No. 22), 2009, p. 224116 (11 pages), DOI: 10.1103/PhysRevB.79.224116.

Richter, "Defect complexes in Li-doped MgO", Physical Review B (vol. 91, No. 19), 2015, p. 195305 (11 pages), DOI: 10.1103/PhysRevB.91.195305.

Wang, et al., "Atom-resolved imaging of ordered defect superstructures at individual grain boundaries", Nature (vol. 479, No. 7373), 2011, pp. 380-383, DOI: 10.1038/nature10593.

U.S. Appl. No. 17/482,865, First Named Inventor: Tadaomi Daibou; Title: "Magnetic Memory Device"; filed Sep. 23, 2021.

* cited by examiner

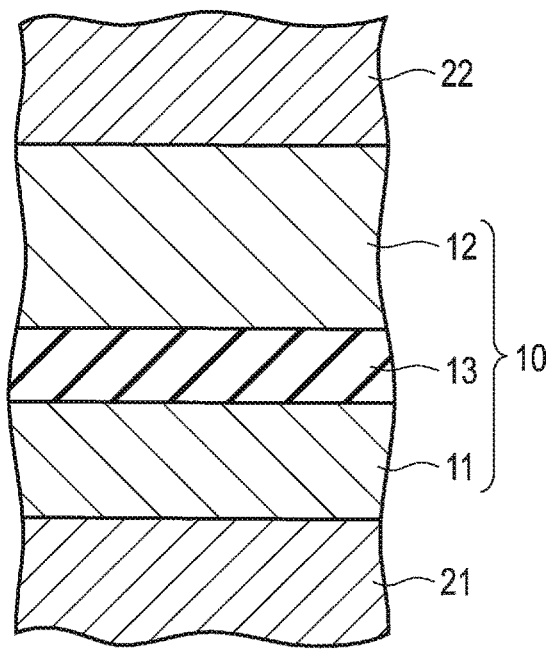
F I G. 1
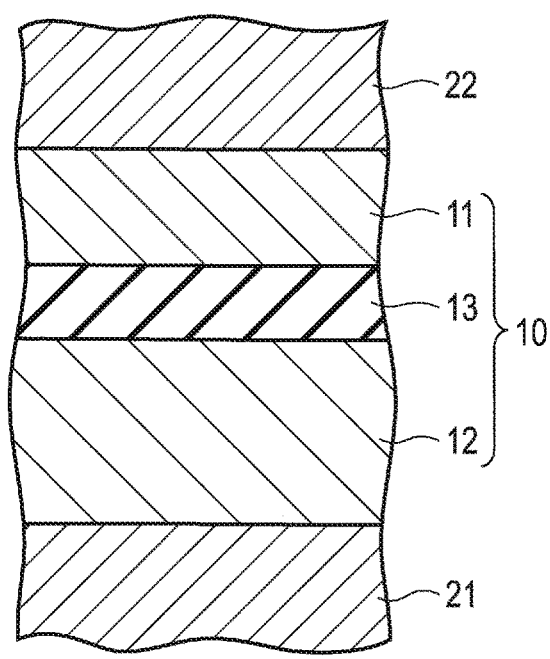
F I G. 2

MAGNETIC MEMORY DEVICE

CROSS-REFERENCE TO RELATED APPLICATIONS

This application is based upon and claims the benefit of priority from Japanese Patent Application No. 2019-052166, filed Mar. 20, 2019, the entire contents of which are incorporated herein by reference.

FIELD

Embodiments described herein relate generally to a magnetic memory device.

BACKGROUND

A magnetic memory device using a magnetoresistive element as a storage element is suggested. In general, the magnetoresistive element has a stacked structure including a storage layer, a reference layer and a tunnel barrier layer provided between the storage layer and the reference layer.

To obtain a magnetoresistive element with excellent characteristics, the improvement of the characteristics of the tunnel barrier layer is important.

However, a tunnel barrier layer with excellent characteristics cannot be always obtained because of a defect or crystal grain boundary included in the tunnel barrier layer.

Thus, there is a demand for a magnetic memory device including a magnetoresistive element comprising a tunnel barrier layer having excellent characteristics in which a defect or crystal grain boundary is compensated both electrically and spatially.

BRIEF DESCRIPTION OF THE DRAWINGS

FIG. 1 is a cross-sectional view schematically showing an example of a magnetic memory device according to an embodiment.

FIG. 2 is a cross-sectional view schematically showing another example of the magnetic memory device according to the embodiment.

DETAILED DESCRIPTION

In general, according to one embodiment, a magnetic memory device includes a stacked structure including: a first magnetic layer having a variable magnetization direction; a second magnetic layer having a fixed magnetization direction; and a nonmagnetic layer provided between the first magnetic layer and the second magnetic layer, and containing magnesium (Mg) and oxygen (O), wherein the nonmagnetic layer further contains an additive element selected from fluorine (F), sulfur (S), hydrogen (H) and lithium (Li).

Embodiments will be described hereinafter with reference to the accompanying drawings.

FIG. 1 is a cross-sectional view schematically showing the structure of a magnetic memory device according to an embodiment.

As shown in FIG. 1, a stacked structure 10 functioning as a magnetoresistive element is provided on a bottom structure (not shown) including a semiconductor substrate, a transistor, a conductive line, etc. A bottom electrode 21 and a top electrode 22 are connected to the ends of the stacked structure 10. The magnetoresistive element is also called a magnetic tunnel junction (MTJ) element. The stacked structure 10 includes a storage layer (first magnetic layer) 11, a reference layer (second magnetic layer) 12 and a tunnel barrier layer (nonmagnetic layer) 13.

The storage layer (first magnetic layer) 11 has a variable magnetization direction. When the magnetization direction is variable, the magnetization direction changes for a predetermined write current. The storage layer 11 contains iron (Fe) and boron (B). The storage layer 11 may contain cobalt (Co) in addition to iron (Fe) and boron (B).

The reference layer (second magnetic layer) 12 has a fixed magnetization direction. When the magnetization direction is fixed, the magnetization direction does not change for a predetermined write current. The reference layer 12 includes a first sublayer in contact with the tunnel barrier layer 13, and a second sublayer provided on the first sublayer. The first sublayer contains iron (Fe) and boron (B). The first sublayer may contain cobalt (Co) in addition to iron (Fe) and boron (B). The second sublayer contains cobalt (Co) and at least one element selected from platinum (Pt), nickel (Ni) and palladium (Pd). Specifically, the second sublayer is formed of a super lattice of, for example, Co/Pt, Co/Ni or Co/Pd.

The tunnel barrier layer (nonmagnetic layer) 13 is an insulating layer provided between the storage layer 11 and the reference layer 12. The tunnel barrier layer 13 contains magnesium (Mg) and oxygen (O). Thus, the main component of the tunnel barrier layer 13 is magnesium oxide (MgO). The details of the tunnel barrier layer 13 are explained later.

The resistance of the magnetoresistive element in a parallel state where the magnetization direction of the storage layer 11 is parallel to the magnetization direction of the reference layer 12 is less than that in an antiparallel state where the magnetization direction of the storage layer 11 is antiparallel to the magnetization direction of the reference layer 12. In other words, when the magnetization direction is in a parallel state, the magnetoresistive element is in a low resistive state. When the magnetization direction is in an antiparallel state, the magnetoresistive element is in a high resistive state. In this way, the magnetoresistive element is capable of storing binary data (0 or 1) based on the resistive state (the low resistive state or the high resistive state).

The above magnetoresistive element is a spin-transfer-torque (STT) magnetoresistive element and has perpendicular magnetization. Thus, the magnetization direction of the storage layer 11 is perpendicular to its main surface. The magnetization direction of the reference layer 12 is perpendicular to its main surface.

The magnetoresistive element shown in FIG. 1 has a bottom-free structure in which the storage layer 11 is provided on the lower side with respect to the reference layer 12. However, as shown in FIG. 2, the magnetoresistive element may have a top-free structure in which the reference layer 12 is provided on the lower side with respect to the storage layer 11.

A shift canceling layer having a function of canceling the magnetic field applied by the reference layer 12 to the storage layer 11 may be further stacked in the stacked structure 10 of the magnetoresistive element. An under layer and a cap layer may be further provided in the stacked structure 10.

Now, the details of the tunnel barrier layer (nonmagnetic layer) 13 are explained.

As explained above, when a defect or crystal grain boundary is included in the tunnel barrier layer, the characteristics of the tunnel barrier layer may be degraded. When magnesium oxide (MgO) is used for the tunnel barrier layer 13, a defect (magnesium (Mg) vacancy, oxygen (O) vacancy, etc.) and crystal grain boundary are considered to be present. Thus, to obtain an excellent tunnel barrier layer, the effective compensation of a defect or crystal grain boundary both electrically and spatially is important.

To compensate the above defect or crystal grain boundary, the tunnel barrier layer (nonmagnetic layer) 13 of the present embodiment contains at least one kind of additive element as described below in addition to magnesium (Mg) and oxygen (O).

As the first example, the tunnel barrier layer 13 contains an additive element selected from fluorine (F), sulfur (S), hydrogen (H) and lithium (Li).

The above additive elements are effective in the compensation of the defect of magnesium oxide (MgO) which is the main component of the tunnel barrier layer 13. Specifically, the above additive elements are capable of compensating the magnesium (Mg) vacancy or oxygen (O) vacancy of magnesium oxide (MgO) both electrically and spatially. No deep bap state is formed in the band gap (energy gap) of magnesium oxide (MgO). Thus, the crystallinity of the tunnel barrier layer 13 can be improved. Further, the leak current of the tunnel barrier layer 13 can be prevented.

When hydrogen (H) is used for the above additive element, as described later, hydrogen (H) is also effective in the compensation of grain boundaries (in other word, boundary gap filling or boundary segregation).

As the second example, the tunnel barrier layer 13 contains a first additive element and a second additive element. A combination of the first additive element and the second additive element is selected from a combination of lithium (Li) and fluorine (F), a combination of aluminum (Al) and nitrogen (N), a combination of gallium (Ga) and nitrogen (N), a combination of nitrogen (N) and fluorine (F), a combination of nitrogen (N) and hydrogen (H), a combination of hydrogen (H) and fluorine (F) and a combination of aluminum (Al) and lithium (Li).

The above combinations of the first additive element and the second additive element are effective in at least one of the compensation of the defect of magnesium oxide (Mg) which is the main component of the tunnel barrier layer 13 and the compensation of the grain boundaries (boundary gap filling or boundary segregation) of magnesium oxide (MgO). Additional explanations are provided below.

In a combination in which the ratio of lithium (Li) to fluorine (F) is 1 to 1 (hereinafter, may be abbreviated as Li—F pair), Li compensates magnesium (Mg) vacancy, and F compensates oxygen (O) vacancy. Thus, a charge compensation pair is formed. Li—F pair is also effective in the compensation of grain boundaries (boundary gap filling or boundary segregation). With respect to the compensation of grain boundaries (boundary gap filling or boundary segregation), the position of a conduction band edge and the position of a valence band edge are important. In general, defective MgO tends to lowering its conduction band edge and raising its valence band edge. Therefore, it is the most desirable that, when an additive element is added to defective MgO containing vacancies or grain boundaries, the position of the conduction band edge should go up, and further, the position of the valence band edge should go down. However, it is effective even when only the position of the conduction band edge goes up. Since the position of the conduction band edge goes up by adding Li and F to defective MgO with grain boundaries, Li—F is also effective in the compensation of grain boundaries (boundary gap filling or boundary segregation).

In a combination in which the ratio of aluminum (Al) to nitrogen (N) is 1 to 1 (hereinafter, may be abbreviated as Al—N pair), Al compensates Mg vacancy, and N compensates O vacancy. Thus, a charge compensation pair is formed. Since the position of the conduction band edge goes up by adding Al and N to defective MgO with grain boundaries (boundary gap filling or boundary segregation), Al—N pair is also effective in the compensation of grain boundaries.

In a combination in which the ratio of gallium (Ga) to nitrogen (N) is 1 to 1 (hereinafter, may be abbreviated as Ga—N pair), Ga compensates Mg vacancy, and N compensates O vacancy. Thus, a charge compensation pair is formed.

In a combination in which the ratio of nitrogen (N) to fluorine (F) is 1 to 1 (hereinafter, may be abbreviated as N—F pair), N compensates O vacancy, and F also compensates O vacancy at another site. Thus, a charge compensation pair is formed.

In a combination in which the ratio of nitrogen (N) to hydrogen (H) is 1 to 1 (hereinafter, may be abbreviated as N—H pair), N compensates O vacancy, and H also compensates O deficiency vacancy at another site. Thus, a charge compensation pair is formed.

In a combination in which the ratio of hydrogen (H) to fluorine (F) is 1 to 1 (hereinafter, may be abbreviated as H—F pair), H enters a lattice, and F compensates O vacancy. Thus, a charge compensation pair is formed.

In a combination of aluminum (Al) and lithium (Li), extra oxygen (O) is added in addition to Al and Li (in other words, extra oxygen (O) is contained in comparison with stoichiometric MgO). Substantially, $AlLiO_2$ is added to MgO. This combination is equivalent to charge compensated co-addition (co-doping), in other words, co-addition (co-doping) of $(Al_2O_3.Li_2O) \times (½)$ according to stoichiometry. The combination can cause charge compensation effects and is effective in the compensation of grain boundaries (boundary gap filling or boundary segregation). Since the position of the conduction band edge goes up by adding $AlLiO_2$ to defective MgO, this combination is effective in the compensation of grain boundaries (boundary gap filling or boundary segregation).

The fluorine (F) explained as the first example also functions as F—F pair. One F compensates O vacancy, and the other F enters a lattice as an interstitial F atom. Thus, a charge compensation pair is formed.

Similarly, the hydrogen (H) explained as the first example also functions as H—H pair. One H compensates O vacancy, and the other H enters a lattice as an interstitial H atom. Thus, a charge compensation pair is formed. Since the position of the conduction band edge goes up by adding H—H pair to MgO, H—H pair is also effective in the compensation of grain boundaries (boundary gap filling or boundary segregation).

When the first and second additive elements are contained in the tunnel barrier layer 13 like the second example, charge compensation effects can be obtained. For example, this specification explains a case where Al—N pair is used for the first and second additive elements. Mg and O are divalent elements. Al and N are trivalent elements. Thus, when Al merely substitutes an Mg site, one electron is excessive. When N merely substitutes an O site, one electron is insufficient. By adding Al—N pair, there is no excess or deficiency in the number of electrons. Thus, charge compensation effects can be achieved.

Now, this specification explains the ratio of the additive element in the tunnel barrier layer 13.

In the first example, the ratio of the additive element in the tunnel barrier layer 13 is preferably less than or equal to 5 at % and greater than or equal to 0.002 at %. Thus, the ratio of the number of atoms of the additive element to the total number of atoms of the magnesium (Mg), oxygen (O) and additive element contained in the tunnel barrier layer 13 is preferably less than or equal to 5 at % and greater than or equal to 0.002 at %.

In the second example, the ratio of the first additive element in the tunnel barrier layer 13 is preferably less than or equal to 5 at % and greater than or equal to 0.002 at %. The ratio of the second additive element in the tunnel barrier layer 13 is preferably less than or equal to 5 at % and greater than or equal to 0.002 at %. Thus, the ratio of the number of atoms of each of the first and second additive elements to the total number of atoms of the magnesium (Mg), oxygen (O) and first and second additive elements contained in the tunnel barrier layer 13 is preferably less than or equal to 5 at % and greater than or equal to 0.002 at %.

The ratio of the additive element is explained in more detail below.

The atomic distance between Mg and O in MgO is approximately 0.21 nm (namely lattice constant of MgO). When the dimension (diameter or the length of each side of the square) of the magnetoresistive element (in other words, the diameter or the length of each side of the tunnel barrier layer) is approximately 20 nm, the area of the magnetoresistive element (in other words, the area of the tunnel barrier layer) is approximately $10 \times 10 \times 3.14 = 314$ nm$^2$ or $20 \times 20 = 400$ nm$^2$. Each of the number of Mg atoms and the number of O atoms per unit cell of MgO lattice is 0.5. The area of the unit cell of MgO is approximately $0.21 \times 0.21 = 0.0441$ nm$^2$. Thus, each of the number of Mg atoms and the number of O atoms present in one monolayer of the MgO tunnel barrier layer having a diameter of 20 nm or a side of 20 nm square in length is $0.5 \times 314/0.0441 = 3560.1$ or $0.5 \times 400/0.0441 = 4535.1$. To realize a tunnel barrier with high breakdown voltage and low tunnel resistance is assumed, it is preferable that the upper limit of the thickness of the MgO tunnel barrier layer should be approximately seven monolayers. When a single Mg vacancy or a single O vacancy is present in the seven monolayers of the MgO tunnel barrier layer, each of the ratio of the Mg vacancy to the number of Mg atoms (the density of Mg vacancy) and the ratio of the O vacancy to the number of O atoms (the density of O vacancy) is $((1/3560.1)/7) \times 100 = 0.0040$ at % (in the cylinder shape case) or $((1/4535.1)/7) \times 100 = 0.0032$ at % (in the square shape case). When the above vacancy is compensated by the additive element, the ratio of the additive element to the number of Mg atoms is greater than or equal to 0.004 at % or 0.003 at %. The ratio of the additive element to the number of O atoms is also greater than or equal to 0.004 at % or 0.003 at %. Thus, the ratio of the sum of additive elements to the total number of atoms (Mg+O) in the MgO tunnel barrier layer is greater than or equal to 0.002 at %.

With regard to a case where Li—F pair is added to MgO, the following fact is confirmed by first-principles calculations. No defect level is generated in the band gap (energy gap) both when the ratio of Li in MgO is less than or equal to 5 at % and when the ratio of F in MgO is less than or equal to 5 at %, in other words, when each of the ratio of the number of Li atoms and the ratio of the number of F atoms to the total number of Mg, O, Li and F atoms contained in the tunnel barrier layer is less than or equal to 5 at %. Moreover, the characteristics of co-doping of the other pairs of additive elements are similar to the above. Thus, with regard to the other pairs of additive elements, in the first example, the ratio of the additive element in the tunnel barrier layer is preferably less than or equal to 5 at %. In the second example, the ratio of each of the first and second additive elements in the tunnel barrier layer is preferably less than or equal to 5 at %.

Regarding the typical grain boundaries included in the doped MgO, namely, the {210} symmetric tilt grain boundaries, the {310} symmetric tilt grain boundaries, the {410} symmetric tilt grain boundaries, the {510} symmetric tilt grain boundaries, the {710} symmetric tilt grain boundaries, the {910} symmetric tilt grain boundaries and the {520} symmetric tilt grain boundaries, the estimation of the element additive amount necessary to fill the gap space of the grain boundaries is as follows.

When it is assumed that the magnetoresistive element (MTJ element) has a square shape in which each side is 20 nm in length, the element area S of the MTJ element is 20 nm×20 nm=400 nm$^2$. The number of Mg or O atoms per unit cell is 0.5. The area ΔS of the unit cell is 0.21 nm×0.21 nm=0.0441 nm$^2$. When the MgO tunnel barrier layer is (001) oriented in the normal direction and the thickness of the MgO tunnel barrier layer is one monolayer, the number N of Mg or O atoms present in the MgO tunnel barrier layer of the MTJ element having a square shape in which each side is 20 nm in length is $0.5 \times 400$ nm$^2$/0.0441 nm$^2$=4535.1. When it is assumed that the MgO consists of square crystal grains whose side is 5 nm in length, the total extension L of the grain boundaries present in the MTJ element is $20 \times 4 + 20 \times 4 = 160$ nm.

Here, in the case of the {210} symmetric tilt grain boundaries, the length ΔL of a single grain boundary is $5^{1/2} \times 0.21$ nm. Thus, in the MTJ element, 160 nm/$(5^{1/2} \times 0.21$ nm$)$=340.7 UNIT grain boundaries are present. The first-principles calculation reveals that, if an element expected to obtain the grain boundary compensation (boundary gap filling or boundary segregation) effect for the gap space of all the grain boundaries is to be added, one element-pair (one MgO pair, corresponding to two atoms) can enter the {210} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus the density of the dopant-pair is approximately $(340.7 \times 1/4535.1) \times 100 = 7.5$ mol %.

In the case of the {310} symmetric tilt grain boundaries, the length ΔL of a single grain boundary is $10^{1/2} \times 0.21$ nm. Thus, in the MTJ element, 160 nm/$(10^{1/2} \times 0.21$ nm$)$=240.9 UNIT grain boundaries are present. The first-principles calculation reveals that, if an element expected to obtain the grain boundary compensation (boundary gap filling or boundary segregation) effect for the gap space of all the grain boundaries is to be added, two element-pairs (two MgO pairs, corresponding to four atoms) can enter the {310} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(240.9 \times 2/4535.1) \times 100 = 10.6$ mol %.

In the case of the {410} symmetric tilt grain boundaries, the length ΔL of a single grain boundary is $17^{1/2} \times 0.21$ nm. Thus, in the MTJ element, 160 nm/$(17^{1/2} \times 0.21$ nm$)$=184.8 UNIT grain boundaries are present. The first-principles calculation reveals that, if an element expected to obtain the grain boundary compensation (boundary gap filling or boundary segregation) effect for the gap space of all the grain boundaries is to be added, two element-pairs (two MgO pairs, corresponding to four atoms) can enter the {410} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(184.8 \times 2/4535.1) \times 100 = 8.1$ mol %.

In the case of the {510} symmetric tilt grain boundaries, the length $\Delta L$ of a single grain boundary is $26^{1/2} \times 0.21$ nm. Thus, in the MTJ element, 160 nm/($26^{1/2} \times 0.21$ nm)=149.4 UNIT grain boundaries are present. The first-principles calculation reveals that, if an element expected to obtain the grain boundary compensation (boundary gap filling or boundary segregation) effect for the gap space of all the grain boundaries is to be added, three element-pairs (three MgO pairs, corresponding to six atoms) can enter the {510} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(149.4 \times 3/4535.1) \times 100 = 9.9$ mol %.

In the case of the {710} symmetric tilt grain boundaries, the length $\Delta L$ of a single grain boundary is $50^{1/2} \times 0.21$ nm. Thus, in the MTJ element, 160 nm/($50^{1/2} \times 0.21$ nm)=107.7 UNIT grain boundaries are present. The first-principles calculation reveals that, if an element expected to obtain the grain boundary compensation (boundary gap filling or boundary segregation) effect for the gaps of all the grain boundaries is to be added, four element-pairs (four MgO pairs, corresponding to eight atoms) can enter the {710} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(107.7 \times 4/4535.1) \times 100 = 9.5$ mol %.

In the case of the {910} symmetric tilt grain boundaries, the length $\Delta L$ of a single grain boundary is $82^{1/2} \times 0.21$ nm. Thus, in the MTJ element, 160 nm/($82^{1/2} \times 0.21$ nm)=84.1 UNIT grain boundaries are present. The first-principles calculation reveals that, if an element expected to obtain the grain boundary compensation (boundary gap filling or boundary segregation) effect for the gap space of all the grain boundaries is to be added, six element-pairs (six MgO pairs, corresponding to 12 atoms) can enter the {910} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(84.1 \times 6/4535.1) \times 100 = 11.1$ mol %.

In general, when the lower limit of the grain diameter of MgO which exhibits a high TMR (Tunnel Magneto Resistance) ratio is approximately 5 nm, in the {310} symmetric tilt grain boundaries, for example, the density of the dopant-pair is approximately 10.6 mol %. Thus, the density of the dopant-pair is approximately 10 mol %. Accordingly, the upper limit of the additive element-pair is considered as approximately 10 mol % of the MgO matrix. In terms of the compensation of grain boundaries (boundary gap filling or boundary segregation), it is preferable that the upper limit of the element-pair added to MgO should be approximately 10 mol %.

In the case of the {520} symmetric tilt grain boundaries, the length $\Delta L$ of a single grain boundary is $29^{1/2} \times 0.21$ nm. Thus, in the MTJ element, 160 nm/($29^{1/2} \times 0.21$ nm)=141.6 UNIT grain boundaries are present. The first-principles calculation reveals that, if an element expected to obtain the grain boundary compensation (boundary gap filling or boundary segregation) effect for the gaps of all the grain boundaries is to be added, eight element-pairs (eight MgO pairs, corresponding to 16 atoms) can enter the {520} symmetric tilt grain boundaries. As the grain boundaries penetrate to the film surface of MgO in a perpendicular direction, the density of the dopant-pair to the MgO tunnel barrier layer does not depend on the thickness of the MgO tunnel barrier layer. Thus, the density of the dopant-pair is approximately $(141.6 \times 8/4535.1) \times 100 = 25.0$ mol %. However, in reality, the {520} symmetric tilt grain boundaries are not solely or evenly present. Grain boundaries having a small gap such as the {210} symmetric tilt grain boundaries are also probably co-existing. Thus, the additive amount of the element-pair necessary to fill the grain boundaries in the MTJ element is considered to be less than 25.0 mol %. When the additive amount exceeds 10 mol %, the TMR ratio is usually decreased. Therefore, even if the presence of the {520} symmetric tilt grain boundaries is assumed, it is preferable that the upper limit of the element-pair added to MgO should be approximately 10 mol %.

An effect of intrinsic defects (magnesium vacancy or oxygen vacancy) on the TMR ratio and RA (resistance-area product) in an MTJ of Fe/MgO/Fe structure and an effect of element addition for compensating the above intrinsic defects on the TMR ratio and RA, is evaluated by the first-principles non-equilibrium Green's function calculations. The calculations reveal the facts described below. The O vacancy degrades the TMR ratio by an increase of leakage current of electron tunneling in an antiparallel spin state. However, the Mg vacancy does not cause such a negative influence. Regarding cation doping (compensation for an Mg vacancy by an additive cation), although Al single doping may reduce the TMR ratio, Li single doping does not cause such a negative influence. Since the number of valence electrons of Al is greater than the number of those of Mg by one, and the excessive electron has higher energy than a Fermi level of the Fe electrode, the excessive electron is released to the Fe electrode and enters to a hybrid orbital of Al—Fe bond, and promotes Fe wave functions penetrating into the interface state in the MgO side and increases leakage current of electron tunneling in an antiparallel spin state. On the other hand, since the number of valence electrons of Li is smaller than those of Mg by one, one electron is extracted from the Fe electrode, and the density of state of Fe in the Fe electrode is reduced, that is, a hole is produced. In this case, different from the case of Al single doping, since penetration of Fe wave functions into the interface states in the MgO side is not promoted, Li single doping exhibits a TMR characteristic equivalent to that of non-defective MgO. Regarding the anion doping (compensation for an O vacancy by an additive anion), N single doping is expected to improve the TMR ratio significantly, whereas F single doping may reduce the TMR ratio. Since the number of valence electrons of N is smaller than those of O by one, filling the oxygen vacancy by N atom compensates gap defect level of the excessive electrons, and improvement of the TMR ratio is expected significantly. On the other hand, since the number of valence electrons of F is greater than those of O by one, and the excessive electron has higher energy than a Fermi level of the Fe electrode, the excessive electron is released to the Fe electrode by filling the O vacancy with F. Only this fact should exhibit a TMR characteristic equivalent to that of the non-defective MgO similar to the case of Li single doping. However, in the case of F, a large structural deformation is caused in a surrounding region, which reduces the TMR ratio. The above described single doping of cation and anion is performed complementarily, that is, it is performed as charge compensation complexes like Li—F pair or Al—N pair, which realizes a TMR characteristic between the TMR ratio and RA equivalent to that of the non-defective MgO, and the MTJ characteristics can be improved.

Now, this specification explains a method for adding a single or a plurality of additive elements to the tunnel barrier layer (MgO tunnel barrier layer) 13.

In a first method, an MgO layer to which an additive element is added is deposited by a sputtering method or an evaporation method using an MgO target to which the additive element is added. As the method for adjusting the additive amount of the additive element, the following methods are considered: a method using a plurality of MgO targets in which the composition of the additive element is adjusted; a method of performing co-sputtering using an MgO target in which the composition of the additive element is fixed and an MgO target to which the additive element is not added; and a deposition method of alternately using an MgO target in which the composition of the additive element is fixed and an MgO target to which the additive element is not added.

In a second method, a substrate is exposed to oxidizing atmosphere using an Mg target to which an additive element is added after an Mg layer to which the additive element is added is deposited or while an Mg layer to which the additive element is added is deposited. As the method for adjusting the additive amount of the additive element, the following methods are considered: a method using a plurality of Mg targets in which the composition of the additive element is adjusted; a method of performing co-sputtering using an Mg target in which the composition of the additive element is fixed and an Mg target to which the additive element is not added; and a deposition method of alternately using an Mg target in which the composition of the additive element is fixed and an Mg target to which the additive element is not added.

In a third method, one or more chips including additive element is attached onto an MgO target. An MgO layer to which the additive element is added is deposited by a sputtering method or an evaporation method. The additive amount of the additive element can be controlled by adjusting the size of the chips of the additive element. Several kinds of chips including different additive elements can also be attached onto an MgO target to realize co-doping.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure, the stacked structure comprising:
   a first magnetic layer having a variable magnetization direction;
   a second magnetic layer having a fixed magnetization direction; and
   a nonmagnetic layer provided between the first magnetic layer and the second magnetic layer, and containing magnesium (Mg) and oxygen (O),
   wherein:
   the nonmagnetic layer further contains an additive element selected from fluorine (F), hydrogen (H), and lithium (Li), and
   the additive element is capable of forming a charge compensation pair.

2. The device of claim 1, wherein the additive element compensates at least one of a defect and a grain boundary in the nonmagnetic layer.

3. The device of claim 1, wherein a ratio of the additive element in the nonmagnetic layer is less than or equal to 5 atomic percent.

4. The device of claim 1, wherein a ratio of the additive element in the nonmagnetic layer is greater than or equal to 0.002 atomic percent.

5. The device of claim 1, wherein the first magnetic layer contains at least iron (Fe) and boron (B).

6. The device of claim 1, wherein the second magnetic layer contains at least iron (Fe) and boron (B).

7. The device of claim 1, wherein the stacked structure forms a spin-transfer-torque (STT) magnetoresistive element.

8. The device of claim 1, wherein the stacked structure forms a magnetoresistive element having perpendicular magnetization.

9. A magnetic memory device comprising a stacked structure, the stacked structure comprising:
   a first magnetic layer having a variable magnetization direction;
   a second magnetic layer having a fixed magnetization direction; and
   a nonmagnetic layer provided between the first magnetic layer and the second magnetic layer, and containing magnesium (Mg) and oxygen (O),
   wherein:
   the nonmagnetic layer further contains a first additive element and a second additive element,
   a combination of the first additive element and the second additive element is selected from a combination of aluminum (Al) and nitrogen (N) and a combination of aluminum (Al) and lithium (Li), and
   the first additive element and the second additive element form a charge compensation pair.

10. The device of claim 9, wherein the combination of the first additive element and the second additive element compensates at least one of a defect and a grain boundary in the nonmagnetic layer.

11. The device of claim 9, wherein a ratio of the first additive element in the nonmagnetic layer is less than or equal to 5 atomic percent, and a ratio of the second additive element in the nonmagnetic layer is less than or equal to 5 atomic percent.

12. The device of claim 9, wherein a ratio of the first additive element in the nonmagnetic layer is greater than or equal to 0.002 atomic percent, and a ratio of the second additive element in the nonmagnetic layer is greater than or equal to 0.002 atomic percent.

13. The device of claim 9, wherein the first magnetic layer contains at least iron (Fe) and boron (B).

14. The device of claim 9, wherein the second magnetic layer contains at least iron (Fe) and boron (B).

15. The device of claim 9, wherein the stacked structure forms a spin-transfer-torque (STT) magnetoresistive element.

16. The device of claim 9, wherein the stacked structure forms a magnetoresistive element having perpendicular magnetization.

17. A magnetic memory device comprising a stacked structure, the stacked structure comprising:
- a first magnetic layer having a variable magnetization direction;
- a second magnetic layer having a fixed magnetization direction; and
- a nonmagnetic layer provided between the first magnetic layer and the second magnetic layer, and containing magnesium (Mg) and oxygen (O), wherein:
- the nonmagnetic layer further contains a first additive element and a second additive element, and
- a combination of the first additive element and the second additive element is selected from a combination of gallium (Ga) and nitrogen (N), a combination of nitrogen (N) and fluorine (F), a combination of nitrogen (N) and hydrogen (H), and a combination of hydrogen (H) and fluorine (F).

18. The device of claim 17, wherein the combination of the first additive element and the second additive element compensates at least one of a defect and a grain boundary in the nonmagnetic layer.

* * * * *